United States Patent
Shibahara et al.

(10) Patent No.: US 6,870,411 B2
(45) Date of Patent: Mar. 22, 2005

(54) PHASE SYNCHRONIZING CIRCUIT

(75) Inventors: Yoshiyuki Shibahara, Tokyo (JP); Masaru Kokubo, Hanno (JP)

(73) Assignee: Renesas Technology Corp., Tokyo (JP)

( * ) Notice: Subject to any disclaimer, the term of this patent is extended or adjusted under 35 U.S.C. 154(b) by 176 days.

(21) Appl. No.: 10/199,068

(22) Filed: Jul. 22, 2002

(65) Prior Publication Data

US 2003/0042985 A1 Mar. 6, 2003

(30) Foreign Application Priority Data

Aug. 30, 2001 (JP) .................................. P2001-261298

(51) Int. Cl.$^7$ .............................................. H03L 7/00
(52) U.S. Cl. ......................... 327/156; 327/158; 331/17
(58) Field of Search ................................ 327/156, 158, 327/157, 261, 107; 331/17, 1 A, 14; 324/76.53

(56) References Cited

U.S. PATENT DOCUMENTS

| | | | | |
|---|---|---|---|---|
| 5,631,587 A | * | 5/1997 | Co et al. ..................... | 327/107 |
| 5,646,968 A | * | 7/1997 | Kovacs et al. ............... | 327/158 |
| 5,870,001 A | | 2/1999 | Osterling et al. ............ | 331/18 |
| 5,933,058 A | * | 8/1999 | Pinto et al. .................... | 331/17 |
| 5,942,949 A | * | 8/1999 | Wilson et al. ................ | 331/17 |
| 6,064,947 A | * | 5/2000 | Sun et al. .................... | 331/187 |
| 6,175,282 B1 | | 1/2001 | Yasuda ......................... | 331/44 |
| 6,215,364 B1 | | 4/2001 | Hwang et al. ................. | 331/57 |
| 6,459,253 B1 | * | 10/2002 | Krusell ........................ | 327/107 |

FOREIGN PATENT DOCUMENTS

| JP | 2000-49597 | 7/1998 |
|---|---|---|
| TW | 349295 | 10/1997 |

OTHER PUBLICATIONS

Ian A. Young, Jeffrey K, Greason and Keng L. Wong, "A PLL Clock Generator with 5 to 110 MHz of Lock Range for Microprocessors", IEEE Journal of Solid–State circuits, vol. 27. No. 11, Nov. 1992, pp. 1599–1607.

Behzad Razavi, "Monolithic Phase–Locked Loops and Clock Recovery Circuits", IEEE Press (1995) pp. 24–25.

Y. Shibahara, M. Kokubo, C. Hwang and H. Aoki, "Evaluation Result of a 1.2V 1GHz CMOS Differential VCO", (2000), p. 38.

* cited by examiner

Primary Examiner—Dinh T. Le
(74) Attorney, Agent, or Firm—Reed Smith LLP; Stanley P. Fisher, Esq.; Juan Carlos A. Marquez, Esq.

(57) ABSTRACT

An object of this invention is to provide a phase synchronizing circuit capable of automatically adjusting a VCO such that the VCO satisfies a predetermined frequency range even in a frequency range in which the VCO oscillates by a leak current generated if a low threshold process is applied. The phase synchronizing circuit is composed of a PLL consisting of a phase comparator, a charge pump, a loop filter, a VCO, and a divider, and a calibration circuit for automatically adjusting a frequency range of the VCO. Before a convergence operation is started, a switch is closed in response to a signal Rst of the calibration circuit such that an output of the loop filter is leveled to the ground and the PLL is set to be an open loop. A VCO output Fo is set at an upper limit frequency or a lower limit frequency in response to a Vcal signal, and its frequency is measured by comparing its period with a period of a reference signal Fr, and signals Hb, Lb used for adjusting the frequency of the VCO are updated. The signals Hb, Lb are updated until the VCO satisfies the predetermined frequency range, and subsequently their values are maintained. The switch opens in response to the signal Rst, and the PLL is changed over to a close loop to start phase synchronization.

20 Claims, 8 Drawing Sheets

PHASE SYNCHRONIZING CIRCUIT

FIELD OF THE INVENTION

The present invention relates to a phase synchronizing circuit and more particularly to a phase synchronizing circuit having a variable frequency oscillation circuit whose frequency tuning range can be automatically set in a predetermined range.

BACKGROUND OF THE INVENTION

A phase synchronizing circuit comprising a phase locked loop (PLL) is often used for generating a high-speed clock inside a logic LSI, adjusting phase with a RAM module connected to the outside of an LSI. The circuit configuration of the PLL is stated in detail, for example, in "A PLL Clock Generator with 5 to 110 MHz of Lock Range for Microprocessor" by I. Young (IEEE Journal of Solid-state Circuits, Vol. SC-27, pp. 1599-1607, November 1992) etc.

Figure 1:
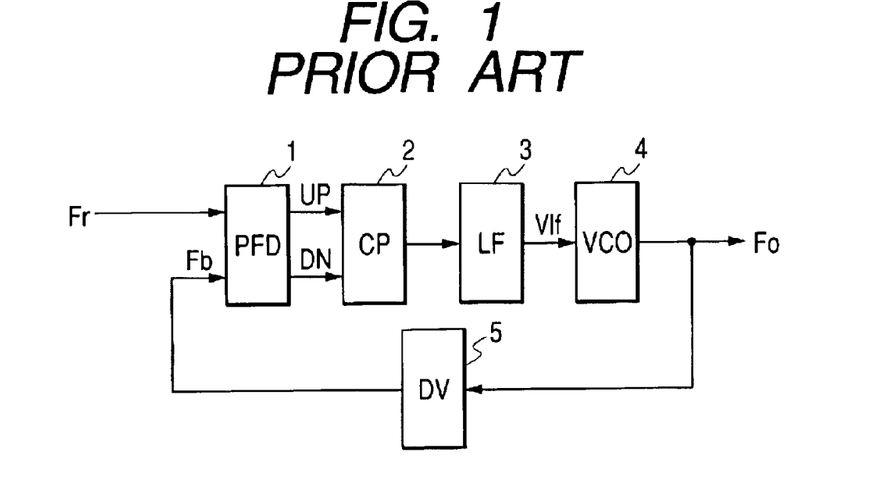
FIG. 1 is a block circuit diagram of a basic configuration of the PLL.

The basic configuration of the PLL is shown in FIG. 1. The PLL is composed of a phase comparator (PFD) 1, a charge pump (CP) 2, a loop filter (LF) 3, a voltage controlled oscillator (VCO) 4, and a divider (DV) 5. The phase comparator 1 detects a phase difference between a reference signal Fr inputted into one terminal thereof and a feedback signal Fb inputted into the other terminal thereof, and outputs pulse signals UP, DN that depend on the phase difference between the two inputs. The charge pump 2 drives the loop filter 3 according to the signals UP, DN. The loop filter 3 smoothes an output of the charge pump 2 and outputs a control voltage V1$f$ to the VCO 4. The VCO 4 oscillates at a frequency that depends on the control voltage V1$f$. Between an output terminal of the VCO 4 and the other terminal into which the feedback signal Fb to the phase comparator 1 is inputted, the divider 5 is provided to constitute a feedback loop.

By adopting such a configuration, the PLL is controlled such that the phase and frequency of the reference signal Fr agree with those of the feedback signal Fb. Here, an arbitrary positive integer can be chosen as a frequency division number N of the divider 5, and the frequency of the signal Fo outputted from the VCO 4 becomes N times that of the reference signal at the time of PLL convergence.

If the above-mentioned PLL circuit is loaded in an LSI as a device for generating a clock, it is desired that the PLL can operate at various frequencies according to different settings, such as a high frequency operation while the LSI carries out processing, and a low frequency operation while being standing by. Therefore, the PLL is expected to be capable of operating in a wide frequency range.

Further, if the PLL is applied to phase adjustment of clocks inside/outside the LSI, the PLL is similarly required to be capable of operating in a wide frequency range because the operating frequency of an external bus varies broadly according to user's target performance.

In order for the PLL to operate in such a wide frequency range as in these cases, the VCO 4 is required to oscillate in the whole target frequency range. However, characteristics of the VCO 4 may vary according to process variations when the PLL is constructed on a semiconductor substrate and also according to environmental variations. If this variation range is large, there may be a case where the VCO 4 cannot satisfy a predetermined frequency range with the same design. Conventionally, the VCO 4 is provided with a function of adjusting oscillation characteristics in conjunction with a calibration technology applied thereto to automatically adjusts the frequency range such that the VCO 4 satisfies a desired oscillation frequency range. Such a technology is disclosed in, for example, JP-A-49597/2000. Hereafter, this conventional PLL is described as an example.

Figure 2:
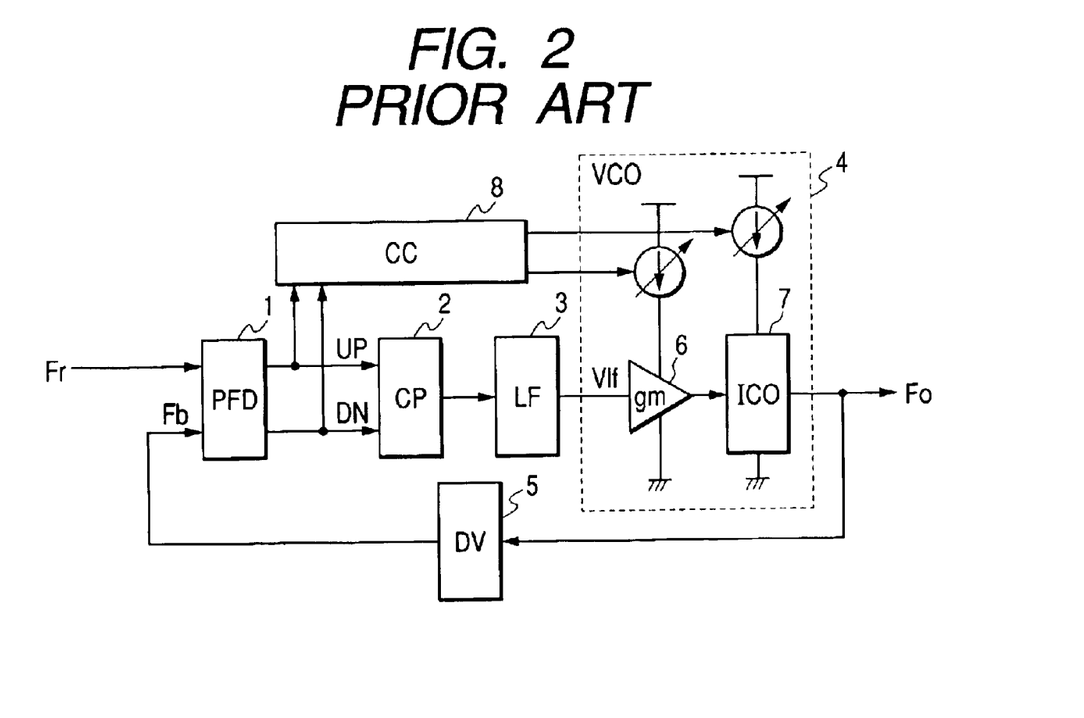
FIG. 2 is a block circuit diagram of a configuration of the conventional PLL with the calibration circuit.

A configuration of the conventional PLL having a calibration circuit is shown in FIG. 2. The configuration with the phase comparator (PFD) 11, the charge pump (CP) 2, the loop filter (LF) 3, and the divider (DV) 5 is the same as that of FIG. 1. The voltage controlled oscillator (VCO) is composed of a gm cell 6 for converting voltage to current and a current controlled oscillator (ICO) 7. Furthermore, this PLL is provided with a calibration control circuit (CC) 8 for optimizing currents flowing in the VCO 4.

Figure 3:
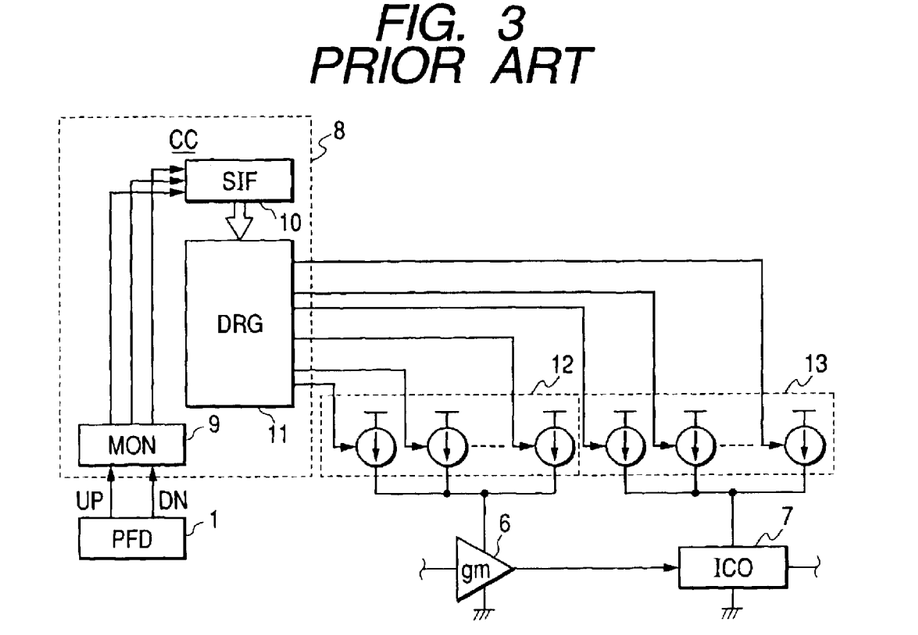
FIG. 3 is a block circuit diagram showing a configuration of the conventional calibration circuit.

An example of the calibration control circuit 8 is shown in FIG. 3. The calibration control circuit 8 has a monitor circuit (MON) 9 for receiving the output signals UP, DN from the phase comparator 1 and, based on monitored values of these, for generating data used for adjusting current flowing in the gm cell 6 and the ICO 7. According to the data generated by this monitor circuit 9, current values of the gm cell 6 and the ICO 7 are adjusted thereby varying the frequency of the VCO 4.

That is, the calibration control circuit 8 writes data defining currents to flow in the gm cell 6 and the ICO 7 in a data register (DRG) 11 (FIG. 3) from the monitor circuit 8 through a serial interface (SIF) 10 and changes the number of connection of constituent current sources in current source banks 12, 13 which are connected to the gm cell and the ICO 7, respectively, by means of outputs of a data register 11.

Next, a calibration operation of the VCO 4 that uses the above-mentioned circuit is explained referring to FIG. 2 and FIG. 3.

The calibration is performed by first setting the PLL to be an open loop and then repeating both a lower limit setting (wherein a frequency at a lower limit value of the control voltage is measured, and the VCO 4 is adjusted until the frequency becomes not higher than a predetermined frequency) and an upper limit setting (wherein a frequency at an upper limit value of the control voltage is measured, and the VCO 4 is adjusted until the frequency becomes not lower than a predetermined frequency) until the VCO 4 satisfies the predetermined oscillation frequency range.

In the lower limit and the upper limit settings, the frequency is determined using the signals UP, DN of the phase comparator 1. During the lower limit decision, the reference signal Fr is set at the lower limit, the control voltage V1$f$ of the VCO 4 is set at the lower limit, and the signals UP, DN are monitored for a period of M cycles such that whether or not the frequency of the VCO 4 satisfies the predetermined frequency range is determined. If the lower limit frequency does not satisfy the predetermined lower limit value, the numbers of the addition of the current source banks 12, 13 are reduced, and the lower limit decision is conducted again. If the lower limit frequency satisfies the predetermined lower limit value, the processing moves to the upper limit decision.

During the upper limit decision, the reference signal Fr is set at the upper limit and the control voltage V1$f$ of the VCO 4 is set at the upper limit such that the frequency decision is conducted as in the lower limit decision. If the upper limit frequency does not satisfy the predetermined upper limit value, the numbers of the addition of the current source banks 12, 13 are increased, and the upper limit decision is conducted again. If the upper limit frequency satisfies the predetermined upper limit value, the flow moves to the lower limit decision.

By repeating the above-mentioned upper limit and lower limit decision operations, the VCO 4 is adjusted so as to satisfy the predetermined frequency range.

In the conventional example described above, if the voltage controlled oscillator operates at a low voltage, it is necessary to use low threshold transistors that were miniaturized. Such a low-voltage operation causes a problem that variations in threshold, temperature, supply voltage, etc. influence a frequency control characteristic significantly thereby further increasing a leak current.

Figure 4:
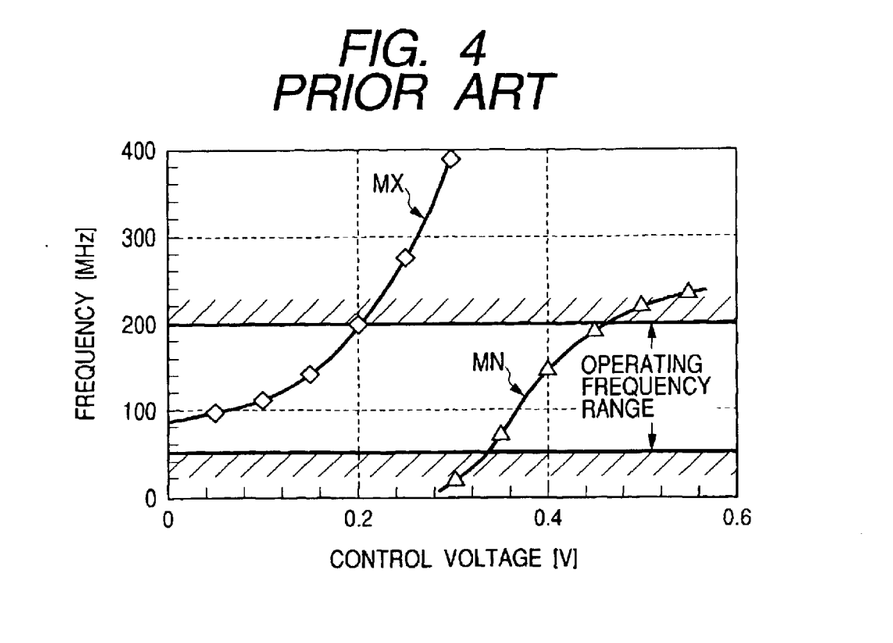
FIG. 4 illustrates the frequency control characteristic of the VCO that uses low-threshold transistors according to the prior art.

FIG. 4 shows a simulation example of the VCO 4 at a supply voltage of 0.7 V. When the threshold value is set to −0.05 V, the supply voltage varies +0.15 V, and the threshold variation varies at +0.15 V due to variations of a manufacture process, and a temperature variation ranges from −40 degrees C. to 125 degrees C. Here, a characteristic line MX of the simulation results under a maximum leak-current condition and a characteristic line MN of the results under a minimum velocity condition, i.e., a lowest frequency condition, are shown in FIG. 4.

In FIG. 4, even if the VCO 4 is designed such that the oscillation frequency thereof satisfies the frequency range of 50-200 MHz under the minimum velocity condition, when the VCO comes to be under the maximum leak current condition (giving the lowest threshold value) due to variations in the manufacture process, the leak current is large and a controllable lowest frequency extends to 100 MHz at most. If the VCO 4 with such characteristics is used for the PLL operating at 50 MHz to 200 MHz, there occurs a problem that the PLL cannot cover the range between 50 MHz and 100 MHz when the VCO 4 comes under the maximum leak-current condition due to the variations in the manufacture process.

When the frequency of the VCO 4 is adjusted by the prior art, the oscillation frequency due to the leak current cannot be reduced because the VCO 4 is adjusted solely by the adjustment of a current source size, and there has not been considered existence of a condition in which the calibration cannot be conducted normally as mentioned above.

Further, in the prior art, the frequency decision is done by monitoring the signals UP, DN of the phase comparator 2 which requires a long measurement cycle for comparing total pulses because structurally neither of the signal UP or the signal DN is outputted continuously so as to lengthen the calibration time. This is presented in "Monolithic Phase-locked Loops and Clock Recovery Circuits" by B. Razavi (IEEE PRESS).

Thus, it is the object of the present invention to provide a phase synchronizing circuit capable of automatically adjusting a voltage controlled oscillator (VCO) such that the VCO satisfies a predetermined frequency range even if the VCO is oscillated by the leak current.

Further, it is another object of the present invention to provide a phase synchronizing circuit capable of performing frequency setting of the VCO at high speed.

SUMMARY OF THE INVENTION

A phase synchronizing circuit according to the present invention includes a phase comparator, a charge pump, a loop filter, a variable frequency oscillation circuit, and a divider for dividing the output of the variable frequency oscillation circuit. The phase synchronizing circuit is constructed so that an oscillation frequency and a phase of the variable frequency oscillation circuit are controlled to be predetermined values, respectively, by inputting a phase difference signal detected by the phase comparator from the reference signal and an output signal of the divider into the variable frequency oscillation circuit through the charge pump and the loop filter. The phase synchronizing circuit is provided with adjusting means for automatically adjusting the variable frequency oscillation circuit such that the frequency tuning range of the said variable frequency oscillation circuit satisfies a predetermined frequency range before the above-mentioned control of the oscillation frequency and the phase of the said variable frequency oscillation circuit starts. In other words, the voltage controlled oscillator is pre-adjusted so as to satisfy the desired frequency range before the PLL convergence starts. This arrangement enables the PLL convergence.

Preferably, the adjusting means is equipped with: an upper limit decision circuit that determines an upper limit of the oscillation frequency of the variable frequency oscillation circuit by using the reference frequency and an output signal of the variable frequency oscillation circuit as its inputs, and that outputs an upper limit adjustment signal that specifies the upper limit of the oscillation frequency; a lower limit decision circuit that determines the lower limit of the oscillation frequency and outputs the lower limit adjustment signal that specifies the lower limit of the oscillation frequency; and a control circuit for witching between the upper limit circuit and the lower limit decision circuit. That is, by providing comparing means for comparing the reference frequency and the output of the voltage controlled oscillator (acting as the variable frequency oscillation circuit), the voltage controlled oscillator can adjust its frequency range, and the means for setting an oscillation frequency of this voltage controlled oscillator at the lower limit and the upper limit such that the adjusting means automatically adjusts the frequency range.

Further, the voltage controlled oscillator is equipped with a delay circuit comprising a variable current source bank whose size is variable and a variable capacitance bank whose size is variable. With this configuration, even if the oscillation due to the leak current occurs, it becomes possible to reduce the oscillation frequency of the voltage controlled oscillator.

Further, it is preferable that the frequency comparing means adapts such a configuration that an output signal of the voltage controlled oscillator is cut out for a predetermined period of time, and pulses contained therein are counted. Therefore, calibration can be performed at high speed.

Moreover, the above-mentioned delay circuit is further provided with another variable current source bank in parallel with the variable current source bank thereof. Therefore, the frequency setting of the voltage controlled oscillator can be done at high speed.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DETAILED DESCRIPTION OF THE PREFERRED EMBODIMENTS

Hereafter preferred embodiments of the present invention are described in detail referring to attached drawings.

<Embodiment 1>

One embodiment of the phase synchronizing circuit (PSC) according to the present invention is described below.

Figure 5:
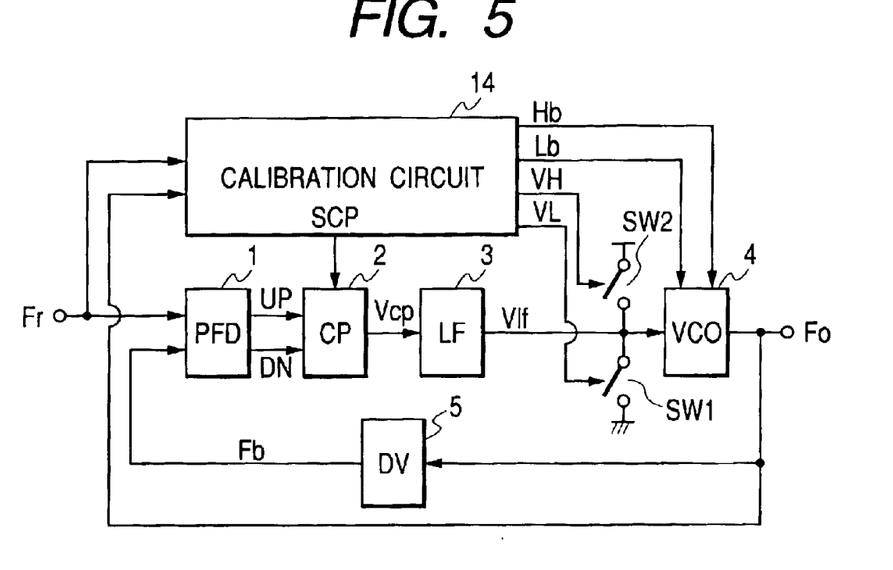
FIG. 5 is a block circuit diagram of a configuration of a first embodiment of the PLL according to the present invention.

The configuration of the PSC according to embodiment is shown in FIG. 5. The PSC of this embodiment is composed of a PLL consisting of the phase comparator (PFD) 1, the charge pump (CP) 2, the loop filter (LP) 3, the voltage controlled oscillator (VCO) 4, and the divider (DV) 5, and a calibration circuit 14 for automatically adjusting the oscillation frequency ranges of the VCO 4.

The PSC of this embodiment operates under two operation states: a VCO calibration period in which the frequency control characteristic of the VCO 4 is adjusted; and a PLL convergence period in which the PLL operates normal signal convergence after the adjustment of the VCO is completed.

First, the VCO calibration period is explained.

During the calibration period, the upper limit decision and the lower limit decision are repeated until the VCO 4 satisfies the predetermined oscillation frequency range, and the adjustment signals Hb, Lb to the VCO 4 are updated. This operation is described in detail.

When the calibration starts, the calibration circuit 14 halts the charge pump 2 and sets the PLL loop to be an open loop. Thereafter, the calibration circuit 14 resets the adjustment signals Hb, Lb to the VCO 4.

The calibration circuit 14 then turns on the switch SW1 with the control signal VL, and turns off the switch SW2 with the control signal VH, levels an output V1f of the loop filter 3 to the ground, sets the frequency of an output Fo of the VCO 4 at the lower limit frequency, and starts the lower limit frequency decision. The output Fo of the VCO 4 is inputted into a lower limit frequency decision circuit 17 (FIG. 6) to be described later, and updates an adjustment signal Lb until the frequency is determined to be not higher than the predetermined frequency so as to effect the adjustment of the VCO 4. The updating of the adjustment signal Lb and a function of adjusting the VCO 4 are described later.

For example, MOS transistors may be used as the switches SW1, SW2. However, the switches may be any device having a switching function. Further, the halting of the charge pump 2 so as to set the PLL to be an open loop is conducted by a signal control priority (SCP) signal from the calibration circuit 14 in FIG. 5, which may be done by other reset signal. For example, a reset signal for the adjustment signals Hb, Lb may also be used for this purpose.

After the lower limit frequency decision is made, the setup by the adjustment signal Lb is maintained, the switch SW1 is turned off by the control signal VL, the switch SW2 is turned on by the control signal VH, a terminal of the output V1f of the loop filter 3 is connected to the supply voltage, the VCO 4 is set at the upper limit frequency so as to start the upper limit frequency decision. During the upper limit decision, the output Fo of the VCO 4 is inputted into the later-described upper limit decision circuit 16 (FIG. 6), and an adjustment signal Hb to the VCO 4 is updated until the output Fo is determined to be not lower than the predetermined frequency. As such, the frequency of the VCO 4 increases. The updating of the adjustment signal Hb is described later. After the upper limit decision is made, a setting by the adjustment signal Hb is maintained, and the processing returns to the lower limit frequency decision again.

The above-mentioned operation is completed when both of the upper limit and lower limit decisions are satisfied in the above-mentioned setting by using the same pair of the adjustment signals Hb, Lb. Subsequently, after a time period in which it is reconfirmed that the upper and lower frequencies meet the predetermined frequency range, the switches SW2, SW1 are turned off by the control signals VH, VL to form the PLL loop, and the processing moves into the PLL convergence period.

Figure 6:
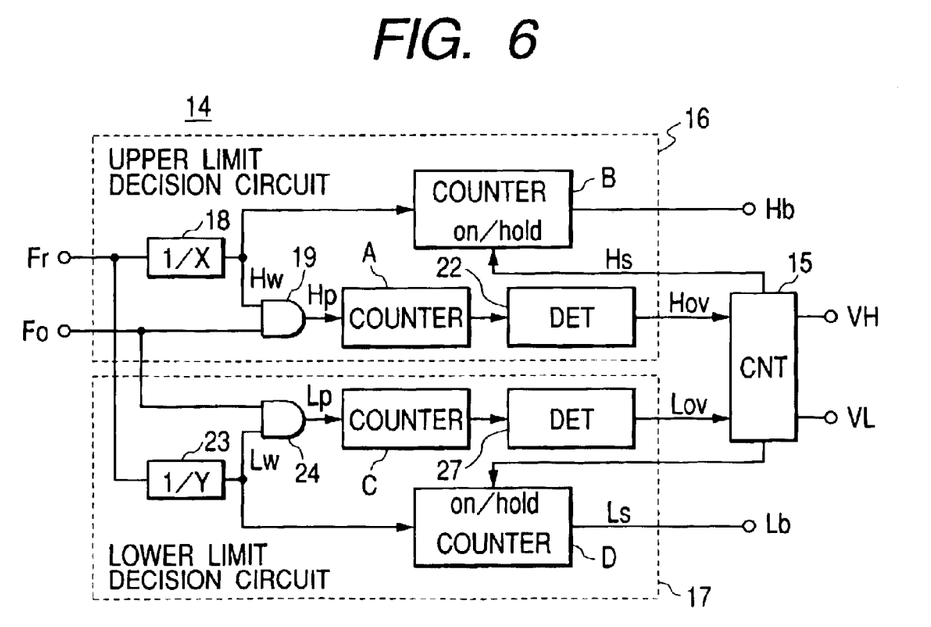
FIG. 6 is a block circuit diagram showing a configuration of the calibration circuit used in the PLL of FIG. 5.

Next, the configuration and the operation of the calibration circuit 14 are explained. As shown in FIG. 6, the calibration circuit 14 is composed of a control circuit (CNT) 15, the upper limit decision circuit 16, and the lower limit decision circuit 17.

The control circuit 15 switches the processing between the upper limit and lower limit decisions. This control circuit 15 receives the upper limit decision end signal Hov outputted from the upper limit decision circuit 16 or the lower limit decision end signal Lov outputted from the lower limit decision circuit 17 to output the control signals VL, VH to the switches SW1, SW2 and to send/hold change-over signals Hs, Ls to the counters B, D each of which holds the setting of the VCO 4.

Next, the upper limit decision circuit 16 is explained.

The upper limit decision circuit 16 is composed of a divider 18 with a frequency division number X, an AND gate 19, counters A, B, and a detector (DET) 22. Hereafter, assuming X=2 (as an example), an operation of the upper limit decision circuit 16 is explained. Here, a value of the frequency division number X is not limited to 2, but can be any arbitrary positive integer according to different applications.

Figure 7:
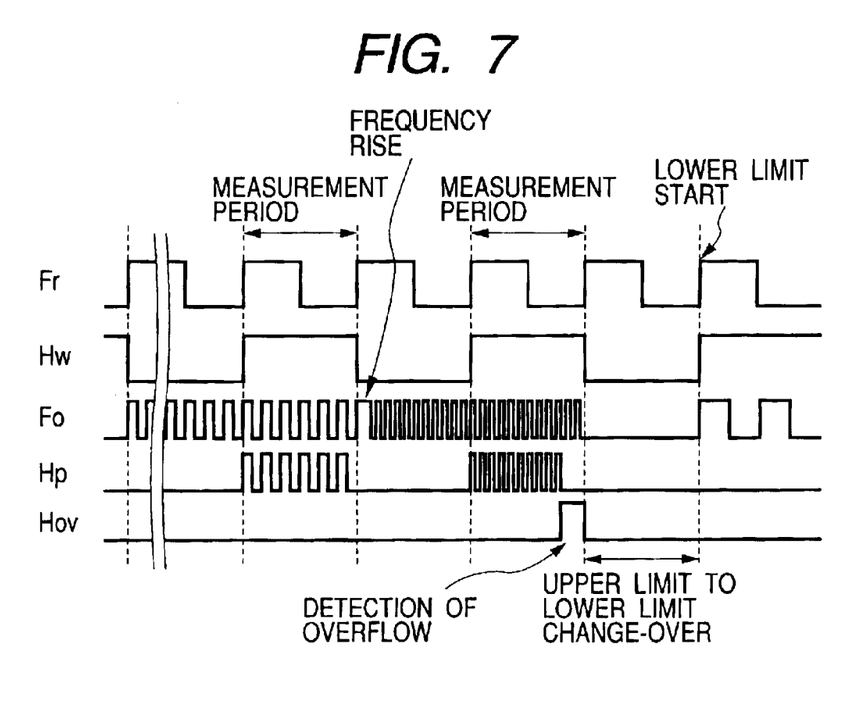
FIG. 7 is a time chart of an upper limit decision circuit used in the calibration circuit of FIG. 6.

A waveform timing chart of the upper limit decision circuit 16 is shown in FIG. 7. The upper limit decision circuit 16 carries out ½ division of the reference signal Fr with the divider 18 to generate a window signal Hw. Next, it carries out logical product of the output Fo of the VCO 4 and the window signal Hw to generate a pulse sequence Hp in a measurement period. This pulse sequence Hp is inputted into the counter A. When the detector 22 determines the pulse sequence Hp to be not lower than the predetermined frequency by detecting any overflow of the counter A, the detector 22 outputs a detection signal Hov. The VCO 4 undergoes the adjustment repeatedly until the overflow is detected. At this time, the counter B detects the number of adjustments to output the adjustment signal Hb to the VCO 4.

As described above, the upper limit decision circuit 16 can conduct the frequency decision for X=2, namely, twice the cycles of the reference signal Fr such that the calibration is performed at high speed.

The lower limit decision circuit 17 is composed of a divider 23 with a frequency division number Y, an AND gate 24, counters C, D, and a detector (DET) 27 (just as the upper limit decision circuit 16). Its operation is also the same as the upper limit decision circuit except that while the detector 22 detects the overflow, the detector 27 detects that the counter C does not overflow so as to determine the frequency to be not higher than the predetermined frequency. The counter D detects the number of adjustments and outputs the adjustment signal Lb to the VCO 4. The lower limit decision circuit is also selects an arbitrary positive integer for the frequency division number Y according to different applications. Moreover, since Y=2, fast calibration is performed.

When both of the upper limit and lower limit frequencies are satisfied for the same pair of the adjustment signals Hb, Lb, the control circuit 15 ends the calibration such that the processing moves into the PLL convergence period.

Figure 8:
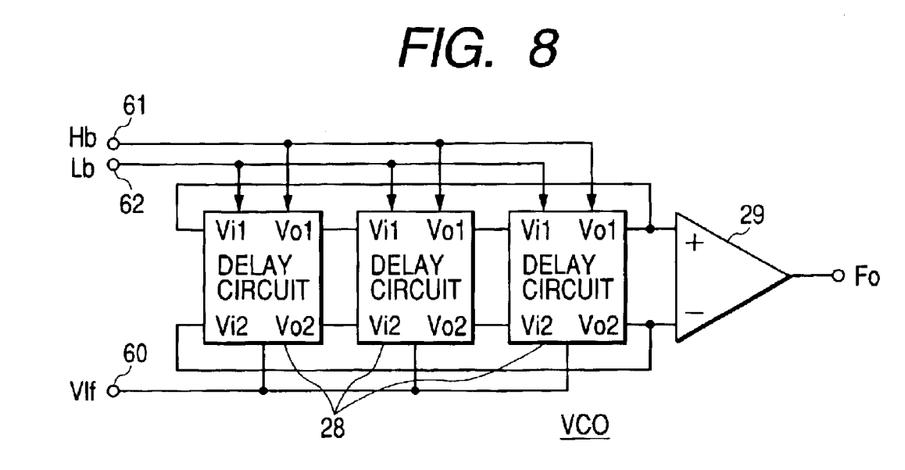
FIG. 8 is a block circuit diagram showing a configuration of the VCO used in the PLL of FIG. 5.

Next, the VCO 4 is explained. The configuration of the VCO 4 is shown in FIG. 8. The VCO 4 is composed of plural stages of delay circuits 28 connected in the form of a ring and a level conversion circuit 29 for converting a signal into logical levels. The reference character 60 designates a terminal via which the control voltage V1$f$ sent to the VCO 4, and the frequency of the VCO 4 is determined by a potential of the control voltage V1$f$. Further, the reference characters 61, 62 designate terminals via which the adjustment signals Hb, Lb each for adjusting the VCO 4 are inputted, respectively. The delay circuit 28 is a circuit for delaying signals inputted via its input terminals Vi0, Vi1 and outputted via its output terminals Vo0, Vo1, respectively. This delay circuit 28 varies the delay timing by changing the potential of the control voltage V1$f$ inputted into the terminal 60. Here, three stages of delay circuits 28 are cascaded as an example, but the configuration is not limited especially to three stages.

Figure 9:
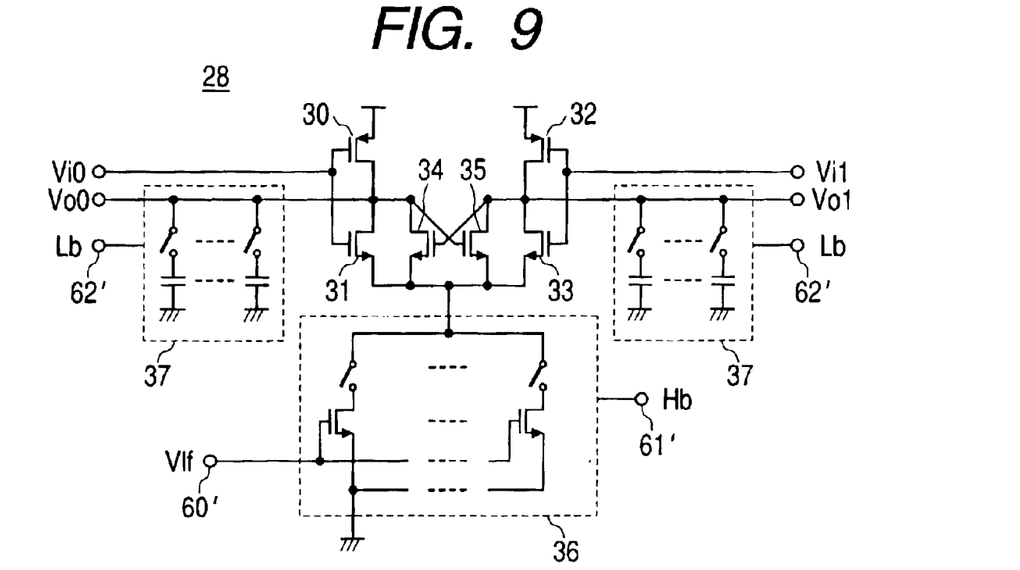
FIG. 9 is a principal part circuit diagram showing a configuration of the delay circuit used in the VCO of FIG. 8.

The delay circuit 28 is realized, for example, in a configuration shown in FIG. 9. The delay circuit 28 shown in FIG. 9 is composed of: a CMOS inverter consisting of transistors 30, 31, a CMOS inverter consisting of transistors 32, 33 that pairs off the above-mentioned CMOS inverter (hereinafter a circuit portion of the transistors 30-33 that constitute a CMOS inverter pair being referred to as a "differential pair"), a positive feedback circuit (i.e., a cross-coupled pair) consisting of NMOS transistors 34, 35, a transistor bank constituting a variable current source bank 36, a terminal 61' to which the adjustment signal Hb that controls connection/non-connection of this variable current source bank 36 is sent, a capacitance bank 37, a terminal 62' to which the adjustment signal Lb that controls connection/non-connection of the capacitance bank 37 is sent, and a terminal 60' to which the control voltage V1$f$ to the VCO 4 is inputted.

The sources and drains of the NMOS transistors 34, 35 that constitute the above-mentioned positive feedback circuit are connected to the sources and the drains of the NMOS transistors 31, 33, respectively. Further, the gate of the NMOS transistor 34 is connected to the drain of the NMOS transistor 35, and the gate of the NMOS transistor 35 is connected to the drain of the NMOS transistor 34. Moreover, the delay circuit 28 is configured such that the sources of the NMOS transistors 34, 35 and the sources of the NMOS transistors 31, 33 of the NMOS inverters are connected in common to the variable current source bank 36.

In FIG. 9, the reference characters Vi1 and Vo1 designate input terminals of the delay circuit 28, and Vo0 and Vo1 designate output terminals of the delay circuit 28.

In the delay circuit 28 shown in FIG. 9, when values of the adjustment signal Hb to be inputted into the terminal 61' and the adjustment signal Lb to be inputted into the terminal 62' are determined, a transistor size of the variable current source bank 36 (number of the transistors in service) and values of capacitance to be added to the output terminals Vo0, Vo1 are determined, respectively.

At this time, a delay time becomes variable by varying the current value of the variable current source bank 36 to vary currents that charge or discharge the capacitances existing at the output terminals Vo0, Vo1. Therefore, if the current value of the variable current source bank 36 is varied by means of the potential of the control voltage V1$f$ inputted into the terminal 60', the delay time can be varied.

As described above, in the delay circuit 28, transistors 34, 35 constituting the positive feedback circuit is inserted such that the output terminals of the transistors 30, 31 and the transistors 32, 33 constituting the differential pair are interconnected. Since these transistors 34, 35 operate to enhance a gain per stage, they reduce the number of delay stages in constituting the VCO 4 with low jitter, lower power consumption, and accelerate operation.

"A Report of Trial Fabrication of a 1.2-V 1-GHz CMOS differential VCO" by Shibahara et al., Proceedings of the Society Convention of the Institute of Electronics, Information and Communication Engineers (2000), paper A-1-38 presents a delay circuit with a positive feedback circuit consisting of NMOS transistors inserted into output terminals of a differential pair consisting of CMOS inverters.

Figure 16:
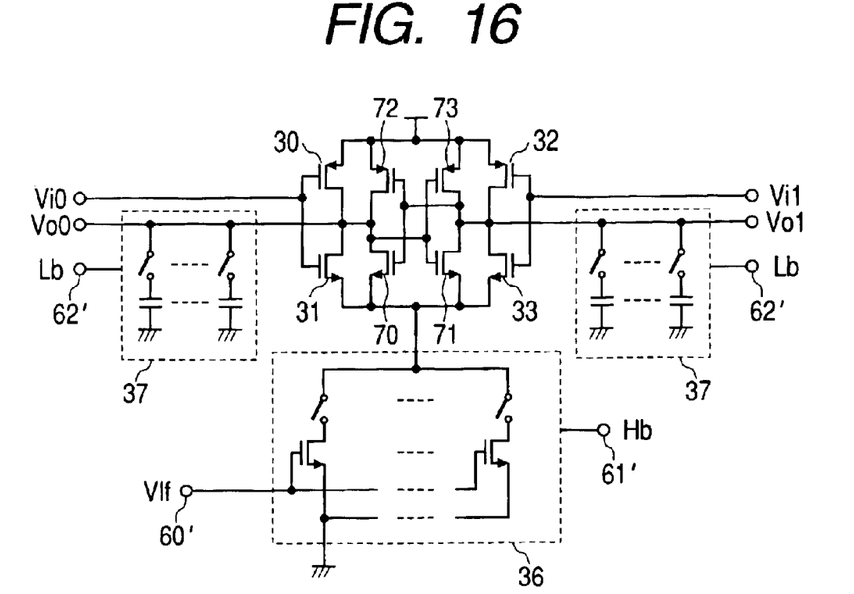
FIG. 16 is a principal part circuit diagram showing another example of a configuration of the delay circuit of FIG. 9.

Incidentally, the delay circuit shown in FIG. 9 includes the positive feedback circuit consisting of the NMOS transistors 34, 35 is inserted to the output terminals of the differential pair composed of the CMOS inverters (the transistors 30-33). However, the delay circuit of the present invention is not limited to this configuration, and it is possible to use, for example, a delay circuit disclosed in JP-A-298302/1999, in which a positive feedback circuit consisting of transistors 70, 71, 72, 73 is inserted between the output terminals of the differential pair composed of the CMOS inverters consisting of the transistors 30-33 and the like.

In the variable current source bank 36, the number of connection that specifies the number of constituent current sources connected with the above-mentioned differential pair is controlled by the adjustment signal Hb inputted to the terminal 61'. Further, the output current of the variable current source bank 36 is determined by the control voltage V1$f$ inputted to the VCO 4. Therefore, it is possible to vary the change amount of the delay time with respect to the control voltage V1$f$ by varying the number of connected CMOSs (current sources) of the variable current source bank 36 which varies the output current quantity with respect to the control voltage V1f. That is, when the number of connected CMOSs is increased, the amount of the change in the delay time with respect to the control voltage V1f becomes large, whereas when the number of connected CMOSs is reduced, the amount of change in the delay time with respect to the control voltage V1f becomes small.

In the capacitance bank 37, the number of connected constituent capacitances in service to the output terminals Vo1, Vo2 can be changed by the adjustment signal Lb inputted to the terminal 62'. The adaptation of such a configuration makes it possible to vary the driving loads added to the output terminals Vo1, Vo2. Accordingly, it is possible to vary the change amount of the delay time with respect to the control voltage V1f. That is, with increasing number of connected capacitances, the amount of the change in the delay time with respect to the control voltage V1f becomes small, whereas with decreasing number of connected capacitances, the amount of change in the delay time with respect to the control voltage V1f becomes large.

As shown in FIG. 8, by connecting the delay circuits 28 in the form of a ring, the oscillation frequency of the VCO 4 can be varied with the control voltage V1f inputted into the terminal 60. As described above, the delay characteristics of the delay circuit 28 can be varied with the number of connected CMOSs in the variable current source bank 36 and the number of connected capacitances in the capacitance bank 37. Therefore, it is possible to modify the frequency control characteristic of the VCO 4 by the adjustment signals Hb, Lb.

By virtue of adaptation of the above-mentioned configuration, the PSC applying the calibration method according to the present invention adjusts the VCO 4 such that it has the predetermined frequency range in the calibration period and then the processing moves into the convergence period.

Next, the operation of the PSC in the convergence period is explained. In FIG. 5, the phase comparator 1 detects a phase difference between the reference signal Fr and the feedback signal Fb, and outputs the signals UP, DN each of whose pulse width depends on the phase difference. The charge pump 2 charges and discharges the loop filter 3 in response to the signals UP, DN. An output signal of the loop filter 3 is inputted into the VCO 4 so as to control the oscillation frequency of the output signal Fo of the VCO 4. The output signal Fo is inputted into the divider 5 with a frequency division number N, and an output thereof is fed back to an input terminal of the feedback signal Fb of the phase comparator. Thus, in the convergence period, the phase synchronizing circuit outputs the output signal Fo having N times the frequency of the reference signal Fr by forming the feedback loop.

<Embodiment 2>

Figure 10:
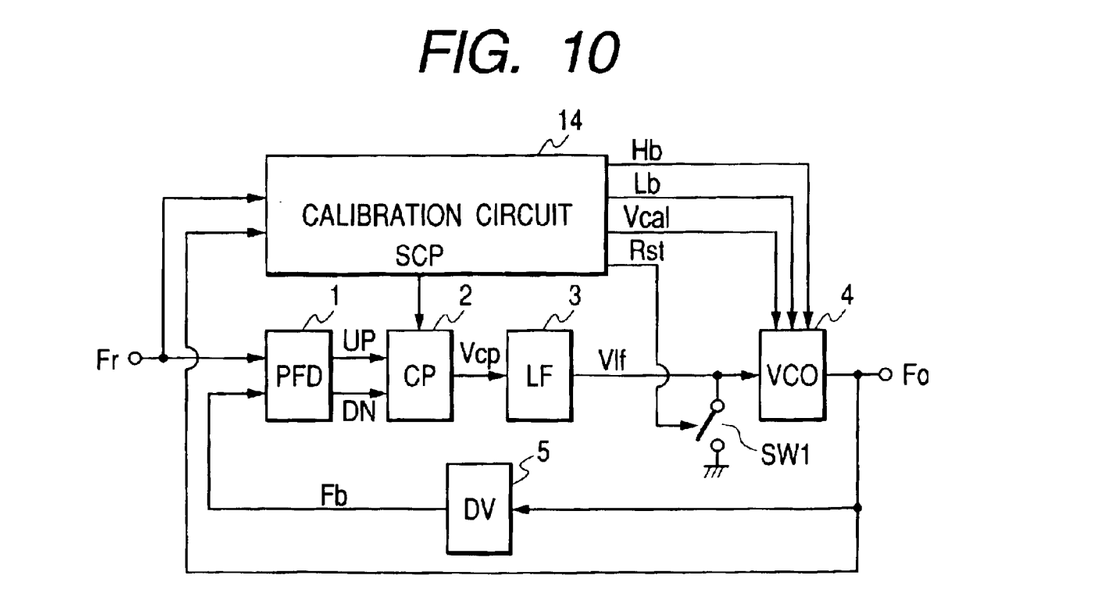
FIG. 10 is a block circuit diagram of a configuration of a second embodiment of the PLL according to the present invention.

The second embodiment of the phase synchronizing circuit according to the present invention is shown in FIG. 10. This embodiment relates to the same PSC of the calibration method as the first embodiment excepts the configuration of the VCO 4 and the output terminal of the calibration circuit 14 for speeding up a change-over of frequencies of the voltage controlled oscillator (VCO) between the upper limit and the lower limit.

Figure 11:
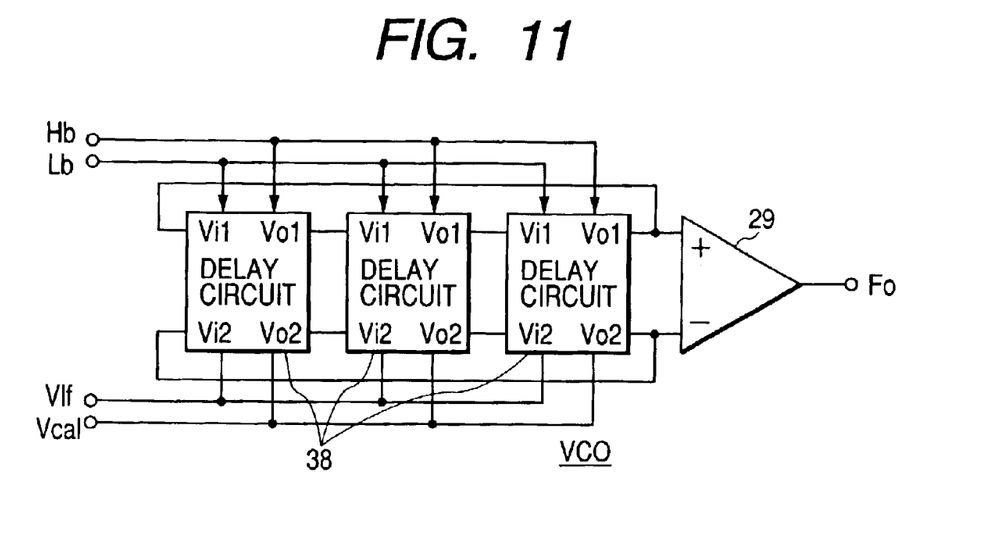
FIG. 11 is a block circuit diagram showing a configuration of the VCO used in the PLL of FIG. 10.

The configuration of the VCO 4 of the second embodiment is shown in FIG. 11. As compared with the VCO 4 in the first embodiment shown in FIG. 8, this VCO 4 is different in that a Vcal terminal is newly added to that VCO 4. The Vcal terminal is described later.

Figure 12:
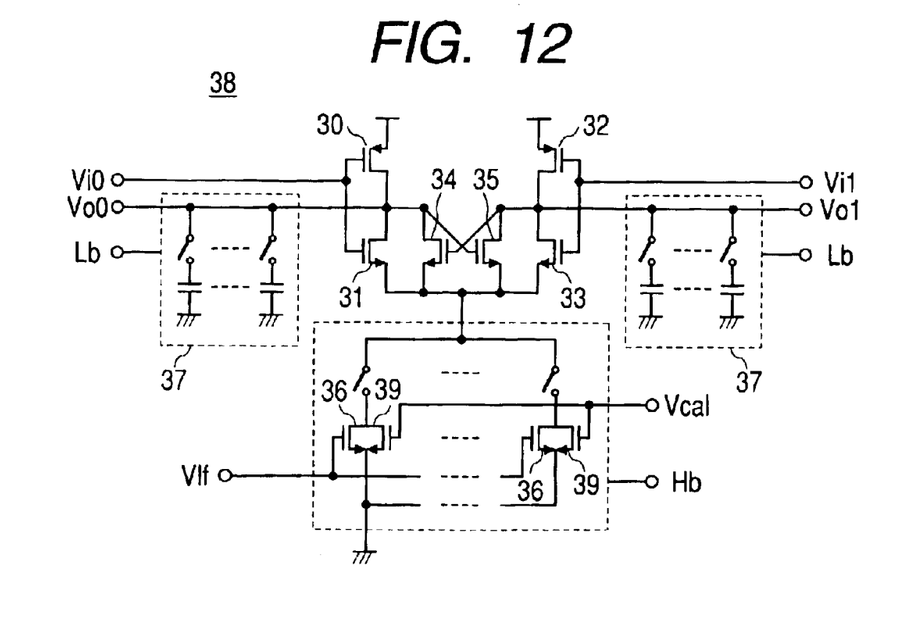
FIG. 12 is a principal part circuit diagram showing a configuration of the delay circuit used in the VCO of FIG. 11.

The delay circuit 38 is shown in FIG. 12. The delay circuit 38 has a configuration such that a variable current source 39 is added to the variable current source 36 of the delay circuit 28 shown in FIG. 9 of the above-mentioned embodiment in such a manner that constituent current sources of the variable current source bank pair off respective constituent current sources of the variable current source bank symmetrically. The gate of each variable current source is connected to the above-mentioned Vcal terminal such that the delay circuit 38 has a configuration in which the current quantity can be varied with the potential of the Vcal terminal.

As shown in FIG. 12, the terminal of the output V1f of the loop filter 3 is connected to the gate terminals of the variable current source bank. In the delay circuit 28 described in the first embodiment, when measuring the characteristics of the VCO 4, it is necessary to set the output V1f of the loop filter 3 to the ground level and the supply voltage for plural times. However, since the loop filter 3 has a large time constant (long frequency setting time), the calibration time becomes long.

On the other hand, in the delay circuit 38, at the time of the calibration (that is performed by setting the PLL loop to be an open loop), the switch SW1 is turned on by the control signal Rst shown in FIG. 10 to level the output V1f of the loop filter 3 to the ground, and the frequency of the VCO 4 is set as the upper limit value or the lower limit value by means of potential applied to the Vcal terminal.

By this setting, the frequency of the VCO can be set up without driving the loop filter 3 so as to speed up the calibration. Further, after the calibration, it is possible to make the PSC perform the convergence, as in the prior art, by connecting the terminal of the Vcal signal to the ground, turning off the switch SW1, and controlling it by means of potential of the output V1f of the loop filter 3.

With the above-mentioned variable current source bank, it becomes possible to set the frequency of the VCO 4 without driving the loop filter 3. However, any other configuration for cutting a connection between the loop filter 3 and the gate terminal of the variable current source bank to set the PLL loop to be an open loop can be applied to calibrate the VCO 4 as in this embodiment.

After the setting of the VCO 4 is completed, the setting by the adjustment signals Hb, Lb is maintained. Further, the gate potential of the variable current source bank is leveled to the ground and the PLL convergence is started.

As mentioned above, by setting up the VCO 4 before the PLL convergence starts, it is possible to make the PLL converge because the convergence frequency surely exists in the frequency tuning range of the VCO 4.

<Embodiment 3>

Figure 13A:
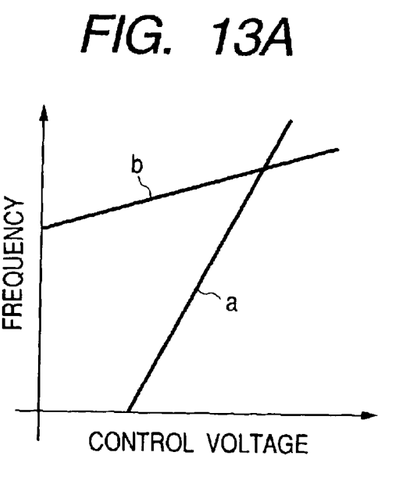
FIG. 13 shows the frequency control characteristic of the VCO used in a third embodiment of the PLL according to the present invention.

Next, the third embodiment is described. As the operating frequency of a Logic LSI etc. is improved, if the voltage controlled oscillator (VCO) is capable of covering a frequency range of a few megahertz (MHz) to a few gigahertz (GHz), the voltage-frequency conversion gain becomes as high as indicated by the characteristic line (a) shown in FIG. 13A. As such, the frequency becomes susceptible to noises generated in the control voltage. Therefore, it is necessary to lower the sensitivity of the VCO to the control voltage to such a state as shown by a characteristic line (b) shown in FIG. 13A.

Figure 14:
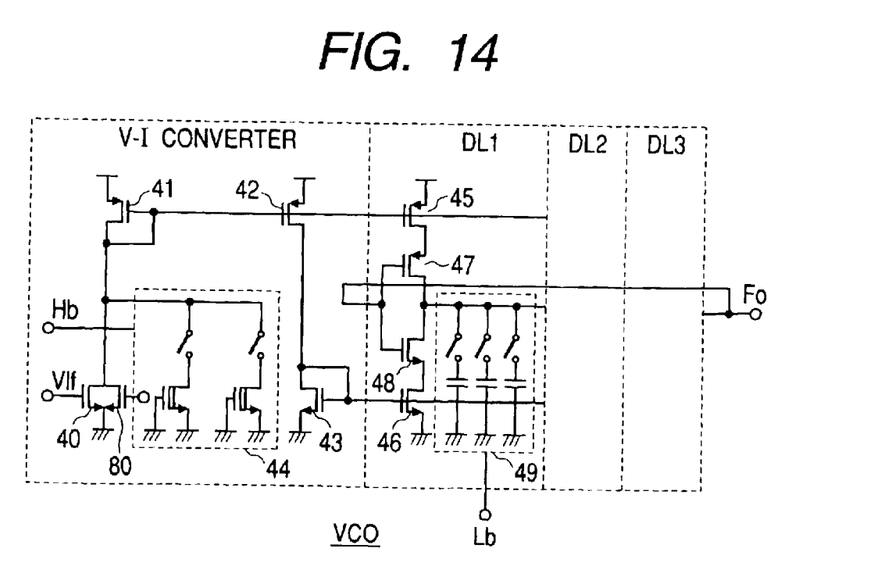
FIG. 14 is a principal part circuit diagram of a configuration of the VCO having the frequency control characteristic shown in FIG. 13.

An example of a configuration that lowers the sensitivity of the VCO is shown in FIG. 14. The VCO of FIG. 14 is composed of: a voltage-current (V-I) converter that consists of a transistor 40 whose current quantity is varied with the potential of the output V1f of the loop filter and a current distribution circuit consisting of transistors 41, 42, 43, and delay circuits DL1, DL2, DL3 each of which consists of transistors 45, 46, 47, 48 and a capacitance bank 49. In FIG. 14, the delay circuits DL2, DL3 have the same configuration as that of the delay circuit DL1. The level conversion circuit 29 for converting the output of the final stage delay circuit into logic level signals, as shown in FIG. 8, is omitted.

Figure 13B:
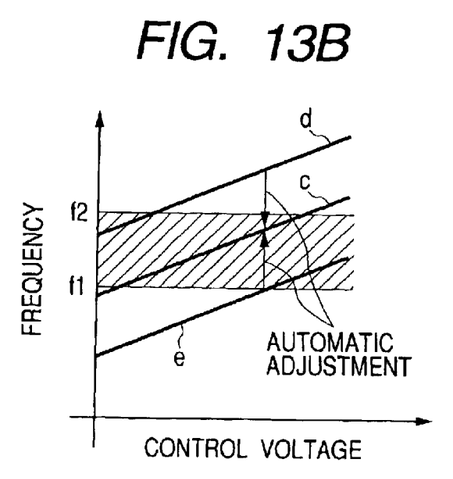

Further, in FIG. 14, the VCO takes a configuration wherein a bias current source is composed of a transistor bank 44 consisting of transistors each having a negative threshold (for example, depletion-type MOS transistors) and the bias current source is connected to the transistor 40 in parallel. This configuration enables the VCO to oscillate even when the control voltage of the VCO is 0 V as shown by the characteristic line (c) of FIG. 13B and also satisfy a target frequency range of f1 to f2.

However, when taking such a configuration, it is necessary to consider the possibility that the characteristics of the transistor bank 44 constituting the VCO may vary due to variation of temperature etc. Such variation causes the characteristics of the VCO to vary. For example, as are shown by the characteristic lines (d) and (e) of FIG. 13B, the VCO fails to satisfy the frequency range between the target frequencies f1, f2 so as to cause the defective performance of the PSC.

Consequently, the phase synchronizing circuit is configured such that the frequency range of the VCO is automatically adjusted by the calibration circuit 14 of the first and second embodiments described above using the adjustment signals Hb, Lb used for changing the numbers of connection within the transistor bank 44 and the capacitance bank 49. Since the VCO can be adjusted so as to satisfy the predetermined frequency range by this arrangement, the defective performance can be prevented from occurring. Note that, if the VCO is applied to the PSC configuration of the second embodiment of FIG. 10, the output V1f is leveled to the ground to set the PLL loop open so as to perform the calibration. As such, transistors 80, which act as a variable current source to be controlled by Vcal potential at gate terminals, should be provided in parallel to the transistor 40 of FIG. 14.

In this embodiment, the transistor bank 44 is used as a current source, but current sources of other configuration are also applicable.

<Embodiment 4>

Figure 15:
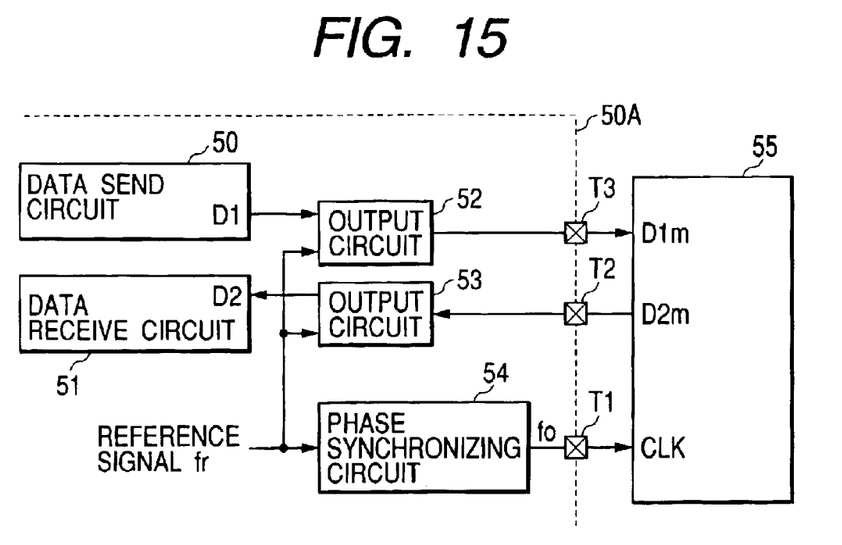
FIG. 15 is a diagram illustrating an application example of the PLL of a fourth embodiment according to the present invention.

An example of an application of the phase synchronizing circuit (PSC) according to the present invention is a phase adjusting circuit for transferring data between two semiconductor integrated circuits each formed on a different semiconductor substrate is described referring to FIG. 15.

FIG. 15 shows an input output system for performing data transfer between a semiconductor integrated circuit chip 50A and a semiconductor integrated circuit chip 55 each mounted on a circuit board (board). The semiconductor integrated circuit chip 50A is, for example, a processor, and the semiconductor integrated circuit chip 55 is, for example, external memory, such as DRAM. Needless to say, these chips are not limited to these devices. Alternatively, the semiconductor integrated circuit chip 50A is a graphic controller and the semiconductor integrated circuit chip 55 is a liquid crystal panel controller.

Hereafter, the operation of the phase adjusting circuit is explained. A reference signal fr of the input output system inside the semiconductor integrated circuit chip 50A is inputted into an output circuit 52, an input circuit 53, and the phase synchronizing circuit 54. The phase synchronizing circuit 54 operates to synchronize the phase of the reference signal fr with that of the output signal fo. The output signal fo is connected to a clock terminal CLK of the external semiconductor integrated circuit chip 55 from an output terminal T1 of the semiconductor integrated circuit chip 50A. The external semiconductor integrated circuit chip 55 operates with this CLK signal as a reference at the time of data sending/receiving When the data is sent out from the semiconductor integrated circuit chip 50A, the output circuit 52 outputs the data D1 from the data send circuit 50 to a terminal D1m of the external semiconductor integrated circuit chip 55 through the terminal T3 in synchronization with the reference signal fr. Further, at the time of data receiving, the input circuit 53 takes in the signal D2m from the external semiconductor integrated circuit chip 55 through the terminal T2 in synchronization with the reference signal fr, and outputs it to the receiving terminal D2 of the data receive circuit 51.

The data transfer is performed in synchronization with the internal reference signal fr by conducting the above-mentioned operation so as to provide fast data sending/receiving.

In FIG. 15, the reference signal fr is not directly connected to an external semiconductor integrated circuit chip 55, but through the phase synchronizing circuit 54. When the reference signal fr is directly connected to the external semiconductor integrated circuit chip 55, a load of the external semiconductor integrated circuit chip 55 as viewed from within the semiconductor integrated circuit chip 50A is as large as a few picofarads (pF). The load varies with the number of external semiconductor integrated circuit chips. Therefore, the reference signal CLK of the external semiconductor integrated circuit chip 55 has a large delay to the internal reference signal fr of the semiconductor integrated circuit chip 50A, the delay is unpredictable, and there occurs a large phase difference between the external reference signal CLK and both of the output circuit 52 and the input circuit 53. Because of this, data sending/receiving becomes difficult in high frequencies when restriction in signal timing becomes stringent. Since the phase synchronizing circuit 54 adjusts this phase difference and supplies a signal in synchronization with the reference signal fr at its output terminal so as to perform faster data sending/receiving.

If any one of the phase synchronizing circuits according to the present invention in the above-mentioned first to third embodiments is used as the phase synchronizing circuit 54 like this, even in the case of a low-voltage semiconductor integrated circuit chip (on which low-threshold transistors are formed), limits of frequency can be automatically set so as to satisfy the required oscillation frequency range in cases of leakage current by fast calibration. As such, the PSC performs the convergence operation surely without defective performance.

According to the present invention, since the convergence operation is started after confirming that the VCO satisfies the desired frequency range, the defective performance of the PLL is prevented.

Further, since the phase synchronizing circuit is provided with the frequency comparing means, the VCO whose frequency range can be adjusted. Providing the means for setting up the frequency limits of the VCO, it becomes possible to automatically adjust the frequency range of the VCO. Since the VCO characteristics can be adjusted not only by the current source but also by the capacitance, the frequency range can be lowered even in the presence of leakage current that could not be adjusted only by means of variability of the current source.

Moreover, since the upper limit and the lower limit of the VCO frequency range can be set up by eliminating the influence of the loop filter, fast calibration becomes possible.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A phase synchronizing circuit comprising a phase comparator, a charge pump, a loop filter, a variable frequency oscillation circuit, adjust means, and a divider for dividing an output of divides the variable frequency oscillation circuit, wherein the variable frequency oscillation circuit is connected with the loop filter and the divider such that an oscillation frequency and a phase of an output signal from the variable frequency oscillation circuit to the divider synchronized to be predetermined values by inputting a phase difference signal between a reference signal and a feedback signal which is detected by the phase comparator into the variable frequency oscillation circuit through the charge pump and the loop filter, the adjusting means for automatically adjusting the variable frequency oscillation circuit is connected with the variable frequency oscillation circuit to automatically adjust a frequency tuning range of the variable frequency oscillation circuit to a predetermined frequency range before synchronizing the oscillation frequency and the phase of the output signal from the frequency oscillation circuit starts, and the adjusting means includes:

an upper limit decision circuit that determines an upper limit of the oscillation frequency of the variable frequency oscillation circuit and outputs an upper limit adjustment signal used for setting the upper limit of the oscillation frequency of the variable frequency oscillation circuit by using the reference frequency and the output signal of the variable frequency oscillation circuit as inputs therein;

a lower limit decision circuit that determines a lower limit of the oscillation frequency of the variable frequency oscillation circuit and outputs a lower limit adjustment signal for setting the lower limit of the oscillation frequency by using the reference frequency and the output signal of the variable frequency oscillation circuit as inputs therein; and a control circuit for controlling change-over between the upper limit decision circuit and the lower limit decision circuit.

2. A phase synchronizing circuit according to claim 1, wherein the variable frequency oscillation circuit includes a delay circuit portion having a plurality of delay circuits which are cascaded, a delay time of each of the delay circuits is varied by current supplied from a first variable current source, and each of the delay circuits is selectively connected with a plurality of capacitances and a plurality of first variable current sources so as to change a number of the connected capacitances and a number of the connected first variable current sources.

3. A phase synchronizing circuit according to claim 2, wherein in each of the delay circuits, the number of the connected first variable current sources is controlled by the upper limit adjustment signal of the adjusting means and the number of the connected variable capacitances is controlled by the lower limit adjustment signal of the adjusting means.

4. A phase synchronizing circuit according to claim 1, wherein the variable frequency oscillation circuit includes at least (1) a voltage-current converter consisting of a third variable current source supplying current which varies with an output potential of the loop filter and a current distribution circuit for distributing the current supplied from the third variable current source to the delay circuits, and (2) a delay circuit portion having a plurality of delay circuits which are cascaded, a delay time of each of the delay circuits is varied by current supplied from the third variable current source, and each of the delay circuits includes a plurality of capacitances selectively connected therein and a bias current source consisting of a plurality of depletion-type transistors with gates and sources grounded such that the transistors are selectively connected in parallel with the third variable current source.

5. A phase synchronizing circuit according to claim 4, wherein a number of the connected capacitances and a number of the connected depletion-type transistors are controlled by the upper limit and lower limit adjustment signals of the adjusting means.

6. A phase synchronizing circuit according to claim 5, wherein a fourth variable current source is connected in parallel with the third variable current source such that each constituent current source of the fourth variable current source pairs off each constituent current source of the third variable current source symmetrically, and terminals used for adjusting current supplied from the fourth variable current source are connected to a terminal different from a terminal which terminals used for adjusting current supplied from the third variable current source are connected to.

7. A phase synchronizing circuit according to claim 4, wherein the voltage-current converter comprises at least one transistor having a current therein which is varied with an output voltage from the loop filter.

8. A phase synchronizing circuit according to claim 4, wherein the voltage-current converter further comprises a current distribution circuit consisting of transistors.

9. A phase synchronizing circuit according to claim 1, wherein each of the upper and lower limit decision circuits includes:

a divider with an arbitrary positive integer as a frequency division number;

an AND gate;

two counters; and a detector.

10. A phase synchronizing circuit according to claim 9, wherein the control circuit outputs control signals to switches and change-over signals the counters.

11. A phase synchronizing circuit comprising a phase comparator, a charge pump, a loop filter, a variable frequency oscillation circuit, adjust means, and a divider for dividing an output of divides the variable frequency oscillation circuit, wherein the variable frequency oscillation circuit is connected with the loop filter and the divider such that an oscillation frequency and a phase of an output signal from the variable frequency oscillation circuit to the divider synchronized to be predetermined values by inputting a phase difference signal between a reference signal and a feedback signal which is detected by the phase comparator into the variable frequency oscillation circuit through the charge pump and the loop filter.

the adjusting means for automatically adjusting the variable frequency oscillation circuit is connected with the variable frequency oscillation circuit to automatically adjust a frequency tuning range of the variable frequency oscillation circuit to a predetermined frequency range before synchronizing the oscillation frequency and the phase of the output signal from the frequency oscillation circuit starts, and the variable frequency oscillation circuit includes a delay circuit portion having a plurality of delay circuits which are cascaded, a delay time of each of the delay circuits is varied by current supplied from a first variable current source, and each of the delay circuits is selectively connected with a plurality of capacitances and a plurality of first variable current sources so as to change a number of the connected capacitances and a number of the connected first variable current sources.

12. A phase synchronizing circuit according to claim 11, wherein in each of the delay circuits, a plurality of second variable current sources are connected in parallel with the plurality of first variable current sources such that each current source of the first variable current sources pairs off each current source of the second variable current sources symmetrically, and terminals for adjusting current supplied from the plurality of second variable current sources are connected to a single terminal different from terminals used for adjusting the current supplied from the plurality of first variable current sources.

13. A phase synchronizing circuit according to claim 11, wherein each of the delay circuits includes:

an inverter pair consisting of two inverters each having two MOS transistors;

a positive feedback circuit consisting of MOS transistors;

a variable current source bank consisting of transistors to be selectively connected to the delay circuit;

a capacitance bank consisting of capacitances to be selectively connected to the delay circuit;

and a terminal via which a control voltage to the variable frequency oscillation circuit is inputted to vary current supplied from the variable current source bank, wherein each gate of one MOS transistor of the positive feedback circuit is connected to each drain of the other MOS transistor of the positive feedback circuit, sources and drains of the MOS transistors of the positive feedback circuit are connected to sources and drains of two MOS transistors of the inverter pair, and sources of the MOS transistors of the positive feedback circuit and the sources of said two MOS transistors of the inverter pair are connected in common to the variable current source bank.

14. A phase synchronizing circuit according to claim 13, wherein the MOS transistors of the positive feedback circuit and said two MOS transistors of the inverter pair are NMOS transistors.

15. A phase synchronizing circuit according to claim 13, wherein each of the delay circuits further includes a second variable current source bank connected to the first variable current source bank such that each constituent current sources of the second variable current source bank pairs off each constituent current source of the first variable current source bank symmetrically.

16. A phase synchronizing circuit according to claim 13, wherein the control voltage is output from the loop filter to the variable current source bank.

17. A phase synchronizing circuit according to claim 13, wherein the control voltage is output from another voltage source other than the loop filter to the variable current source bank.

18. A phase synchronizing circuit according to claim 11, wherein the variable frequency oscillation circuit includes at least (1) a voltage-current converter consisting of a third variable current source supplying current which varies with an output potential of the loop filter and a current distribution circuit for distributing the current supplied from the third variable current source to the delay circuits, and (2) a delay circuit portion having a plurality of delay circuits which are cascaded, a delay time of each of the delay circuits is varied by current supplied from the third variable current source, and each of the delay circuits includes a plurality of capacitances selectively connected therein and a bias current source consisting of a plurality of depletion-type transistors with gates and sources grounded such that the transistors are selectively connected in parallel with the third variable current source.

19. A phase synchronizing circuit according to claim 18, wherein a number of the connected capacitances and a number of the connected depletion-type transistors are controlled by the upper limit and lower limit adjustment signals of the adjusting means.

20. A phase synchronizing circuit according to claim 18, wherein a fourth variable current source is connected in parallel with the third variable current source such that each constituent current source of the fourth variable current source pairs off each constituent current source of the third variable current source symmetrically, and terminals used for adjusting current supplied from the fourth variable current source are connected to a terminal different from a terminal which terminals used for adjusting current supplied from the third variable current source are connected to.

* * * * *